(12) United States Patent
Yoshimura (10) Patent No.: US 10,797,043 B2
(45) Date of Patent: Oct. 6, 2020

(54) SEMICONDUCTOR DEVICE WITH BIDIRECTIONAL DIODE

(71) Applicant: ABLIC Inc., Chiba-shi, Chiba (JP)

(72) Inventor: Mitsuhiro Yoshimura, Chiba (JP)

(73) Assignee: ABLIC INC., Chiba (JP)

( * ) Notice: Subject to any disclaimer, the term of this patent is extended or adjusted under 35 U.S.C. 154(b) by 0 days.

(21) Appl. No.: 16/241,259

(22) Filed: Jan. 7, 2019

(65) Prior Publication Data
US 2019/0252542 A1 Aug. 15, 2019

(30) Foreign Application Priority Data

Feb. 9, 2018 (JP) .................................. 2018-021979

(51) Int. Cl.
*H01L 29/76* (2006.01)
*H01L 27/02* (2006.01)
(Continued)

(52) U.S. Cl.
CPC ...... *H01L 27/0255* (2013.01); *H01L 27/3246* (2013.01); *H01L 27/3279* (2013.01);
(Continued)

(58) Field of Classification Search
CPC ............... H01L 29/785; H01L 29/6656; H01L 29/6681; H01L 21/0228; H01L 29/4232; H01L 29/4966; H01L 29/0847; H01L 21/823864; H01L 23/5329; H01L 21/28088; H01L 29/66545; H01L 21/823821; H01L 29/66795; H01L 29/7848; H01L 21/823431; H01L 29/41791; H01L 29/66553; H01L 21/823418; H01L 21/31116;
(Continued)

(56) References Cited

U.S. PATENT DOCUMENTS 6,413,822 B2 * 7/2002 Williams ............ H01L 27/0255
438/270
6,455,378 B1 * 9/2002 Inagawa ............. H01L 29/7808
438/270
(Continued)

FOREIGN PATENT DOCUMENTS

JP 2010-177454 A 8/2010

*Primary Examiner* — Shouxiang Hu
(74) *Attorney, Agent, or Firm* — Brinks Gilson & Lione (57) ABSTRACT

Provided is a semiconductor device, including: a drain region of a first conductivity type and a source region of the first conductivity type in a semiconductor substrate; a base region of a second conductivity type between the drain region and the source region; a base contact region of the second conductivity type in the base region; a gate electrode on the base region through a gate insulating film; a bidirectional diode overlapping with the gate electrode in a first direction perpendicular to the semiconductor substrate, and having one end electrically connected to the gate electrode and the other end electrically connected to the source region; a source metal layer electrically connected to the source region, the base contact region, and the other end of the bidirectional diode; and a gate metal layer electrically connected to the gate electrode, and overlapping with the source metal layer in the first direction.

6 Claims, 6 Drawing Sheets

(51) Int. Cl.
    *H01L 29/78*      (2006.01)
    *H01L 29/423*     (2006.01)
    *H01L 29/08*      (2006.01)
    *H01L 29/16*      (2006.01)
    *H01L 29/10*      (2006.01)
    *H01L 27/32*      (2006.01)
    *H01L 51/52*      (2006.01)

(52) U.S. Cl.
    CPC ...... *H01L 29/0865* (2013.01); *H01L 29/0882* (2013.01); *H01L 29/1095* (2013.01); *H01L 29/16* (2013.01); *H01L 29/4236* (2013.01); *H01L 29/7804* (2013.01); *H01L 29/7813* (2013.01); *H01L 51/5256* (2013.01)

(58) Field of Classification Search
    CPC ............. H01L 29/41783; H01L 29/866; H01L 27/0629; H01L 29/7808; H01L 29/7813; H01L 29/66106
    See application file for complete search history.

(56) References Cited

U.S. PATENT DOCUMENTS

| | | | |
|---|---|---|---|
| 6,580,121 B2 * | 6/2003 | Hisamoto | H01L 27/0629 |
| | | | 257/328 |
| 2009/0039432 A1 * | 2/2009 | Nishimura | H01L 27/0255 |
| | | | 257/362 |
| 2010/0187640 A1 | 7/2010 | Miyata | |
| 2010/0224931 A1 * | 9/2010 | Hsieh | H01L 27/0255 |
| | | | 257/328 |

* cited by examiner

SEMICONDUCTOR DEVICE WITH BIDIRECTIONAL DIODE

RELATED APPLICATIONS

This application claims priority under 35 U.S.C. § 119 to Japanese Patent Application No. 2018-021979 filed on Feb. 9, 2018, the entire content of which is hereby incorporated by reference.

BACKGROUND OF THE INVENTION

1. Field of the Invention

The present invention relates to a semiconductor device, and more particularly, to a semiconductor device including a vertical MOSFET and a bidirectional diode which protects a gate insulating film of the vertical MOSFET from electrostatic discharge (ESD).

2. Description of the Related Art

One of semiconductor devices of the prior art including a vertical MOSFET is proposed in, for example, Japanese Patent Application Laid-open No. 2010-177454. In the proposed semiconductor device, a metal layer connected to a source and a metal layer connected to a gate electrode each have a two-layer structure.

A part of an upper surface of an upper metal layer in the two-layer structure metal layer connected to the gate electrode is used as a gate pad portion, to thereby arrange a bidirectional diode in a manner that avoids an overlap with the gate pad portion. This keeps the bidirectional diode from being placed below the gate pad portion, and a vertical MOSFET can accordingly be placed below the gate pad portion as well, that is, a large area can be secured for an element region.

The configuration disclosed in Japanese Patent Application Laid-open No. 2010-177454, however, does not allow a vertical MOSFET to be placed in a region in which the bidirectional diode is formed. It is therefore difficult to expand the element region further.

SUMMARY OF THE INVENTION

It is therefore an object of the present invention to provide a semiconductor device that allows a vertical MOSFET to be formed also in a region in which a bidirectional diode is formed.

In one embodiment of the present invention, there is provided a semiconductor device, including: a semiconductor substrate; a drain region of a first conductivity type and a source region of the first conductivity type formed in the semiconductor substrate; a base region of a second conductivity type formed between the drain region and the source region; a base contact region of the second conductivity type formed in the base region and being higher in concentration than the base region; a gate electrode formed on the base region through a gate insulating film so that a channel is formed in the base region; a bidirectional diode overlapping with the gate electrode in a first direction perpendicular to a surface of the semiconductor substrate, and having one end electrically connected to the gate electrode and the other end electrically connected to the source region; a source metal layer electrically connected to the source region, the base contact region, and the other end of the bidirectional diode; and a gate metal layer electrically connected to the gate electrode, and overlapping at least partially with the source metal layer in the first direction, in at least a part of a region on the semiconductor substrate.

According to one embodiment of the present invention, the bidirectional diode is provided so as to overlap with the gate electrode in the direction perpendicular to the surface of the semiconductor substrate. In other words, the bidirectional diode and the vertical MOSFET which includes the gate electrode, the drain region, the source region, and the base region, can be formed in the same region in plan view. An element region can accordingly be expanded even if the bidirectional diode is formed in the element region.

BRIEF DESCRIPTION OF THE DRAWINGS

Embodiments of the invention will now be described, by way of example, with reference to the accompanying drawings, in which.

DETAILED DESCRIPTION OF THE PREFERRED EMBODIMENTS

The invention will now be described herein with reference to illustrative embodiments.

Figure 1:
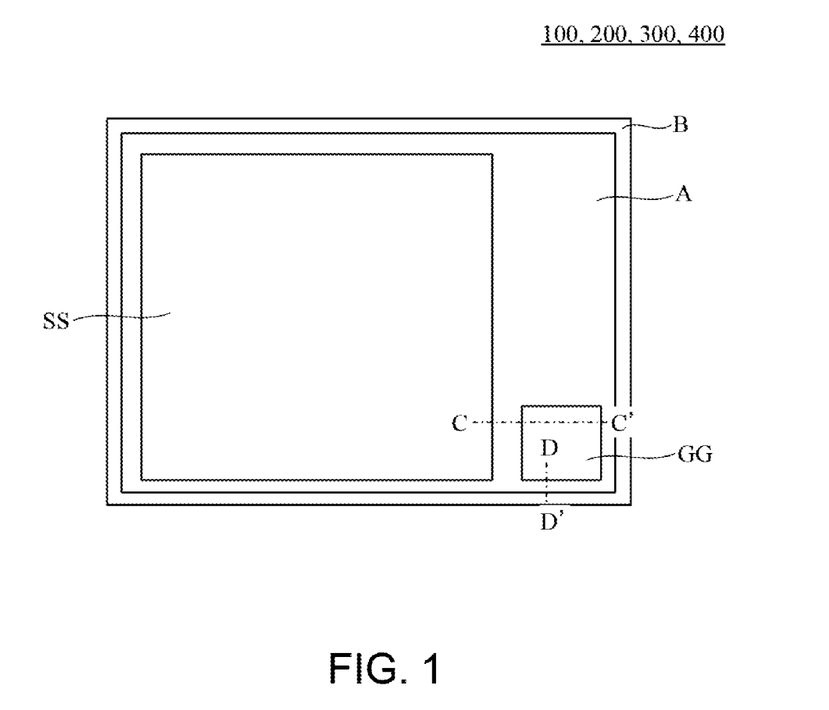
FIG. 1 is a diagram for illustrating the planar structure of a semiconductor device according to each embodiment of the present invention.

FIG. 1 is a plan view for illustrating a semiconductor device 100 including a vertical MOSFET according to a first embodiment of the present invention. The plan view is common to semiconductor devices 200 to 400 according to a second embodiment to a fourth embodiment of the present invention which are described later.

As illustrated in FIG. 1, the semiconductor device 100 according to the first embodiment of the present invention includes an active region A and a field region B, and an N-type (a first conductivity type) vertical MOSFET (not shown), a gate pad GG, and a source pad SS are provided in the active region A.

Figure 2:
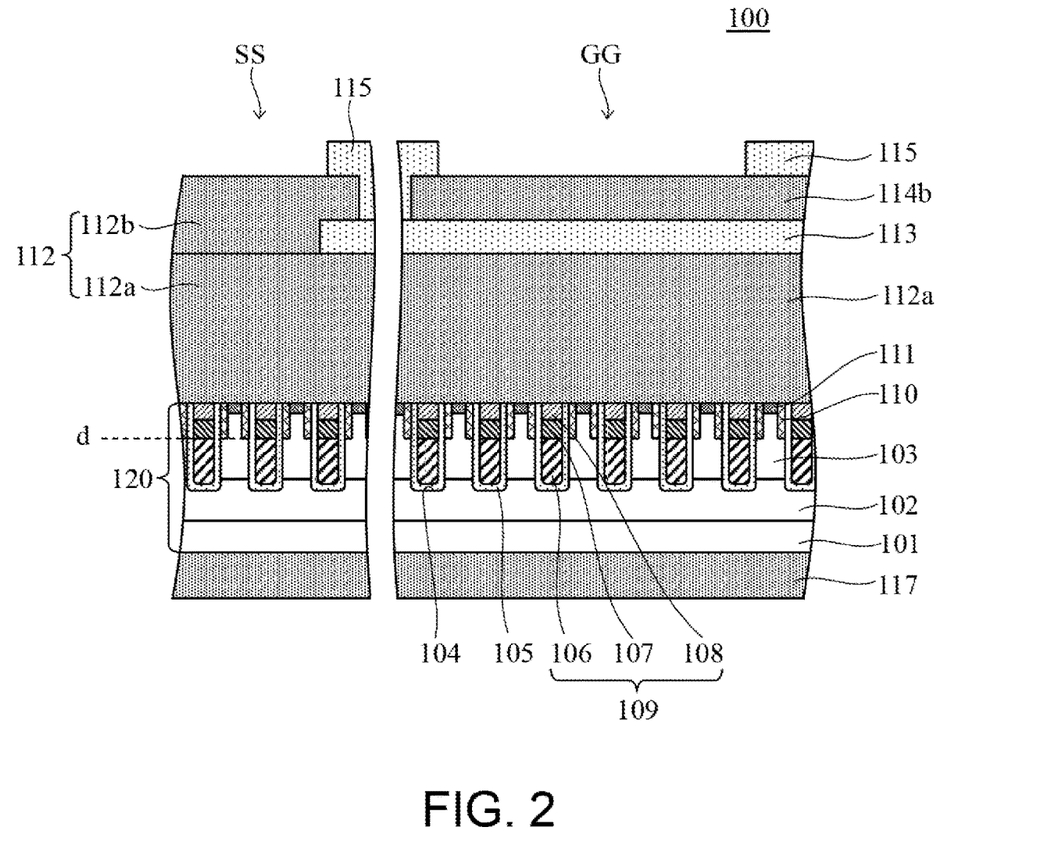
FIG. 2 is a sectional view taken along the line C-C' of the semiconductor device of FIG. 1 to illustrate the structure of a semiconductor device according to a first embodiment of the present invention.

FIG. 2 is a sectional view taken along the line C-C' of FIG. 1 to illustrate the structure of the vertical MOSFET in the semiconductor device 100 according to the first embodiment of the present invention.

As illustrated in FIG. 2, the semiconductor device 100 according to the first embodiment has a semiconductor substrate 120 which includes an N-type (first conductivity type) high-concentration semiconductor layer 101, an N-type drift region 102, and a P-type (a second conductivity type) base region 103. The drift region 102 is provided on the high-concentration semiconductor layer 101 and is lower in impurity concentration than the high-concentration semiconductor layer 101. The base region 103 is formed on the drift region 102. This semiconductor substrate 120 is formed by, for example, preparing an N-type single-crystal silicon substrate as the high-concentration semiconductor layer 101, growing an N-type epitaxial silicon layer on the single-crystal silicon substrate, and implanting P-type impurities from an upper surface of the epitaxial silicon layer to leave the drift region 102 in a lower part of the epitaxial silicon layer and to form the base region 103 in an upper part of the epitaxial silicon layer. The high-concentration semiconductor layer 101 and the drift region 102 form a drain region. A drain electrode 117 is provided on a rear surface of the semiconductor substrate 120.

A plurality of trenches 104 reaching an upper surface of the drift region 102 (the drain region) from an upper surface of the semiconductor substrate 120 are formed in the base region 103. A gate insulating film 105 is formed in each trench 104 so as to cover inner bottom and side surfaces of the trench 104. A gate electrode 106 composed of an N-type polysilicon layer is embedded in the trench 104 from the bottom of the trench 104 to a depth d which is measured from the upper surface of the semiconductor substrate 120 through the gate insulating film 105. A P-type polysilicon layer 107 and an N-type polysilicon layer 108 are layered on the gate electrode 106 in this order in a direction perpendicular to a surface of the semiconductor substrate 120, and are embedded in the trench 104. The gate electrode (n-type polysilicon layer) 106, the P-type polysilicon layer 107, and the N-type polysilicon layer 108 constitute a bidirectional diode 109 with the gate electrode 106 as its one end and the N-type polysilicon layer 108 as its other end.

An N-type source region 110 having the depth d from the upper surface of the semiconductor substrate 120 is formed in a region adjacent to each upper external side surface of the trench 104. A part of the base region that is between the source region 110 and the drift region 102 (the drain region) and that is along the external side surface of the trench 104 serves as a channel region. A P-type base contact region 111 higher in impurity concentration than the base region 103 is formed on a part of the upper surface of the semiconductor substrate 120 that is between adjacent source regions in the base region 103. The source region 110 is formed by, for example, rotational ion implantation conducted while the substrate is tilted, or ion implantation conducted a plurality of times while varying the direction of the tilt, after the gate electrode 106 is formed and before the polysilicon layer 107 is formed.

An upper surface of the gate insulating film 105, an upper surface of the polysilicon layer 108, an upper surface of the source region 110, and an upper surface of the base contact region 111 are on the same plane, and a lower source metal layer 112a of a source metal layer 112 which has a two-layer structure, is formed in contact with the upper surfaces. This gives the bidirectional diode 109 a configuration in which the polysilicon layer 108 at the other end is electrically connected to the source region 110. The upper surface of the source region 110 and the upper surface of the base contact region 111 are preferred to have an impurity concentration of $1 \times 10^{19}/cm^3$ or higher and an impurity concentration of $1 \times 10^{20}/cm^3$ or higher, respectively, in order to form an ohmic contact with the source metal layer 112 (the lower source metal layer 112a).

An interlayer insulating film 113 is formed on the lower source metal layer 112a so as to cover at least a region corresponding to the region in which the gate pad GG is formed and to expose a region corresponding to the region in which the source pad SS is formed.

An upper source metal layer 112b is formed to connect to the lower source metal layer 112a, in a region above the lower source metal layer 112a that corresponds to the region in which the source pad SS is formed. That is, the lower source metal layer 112a and the upper source metal layer 112b constitute the source metal layer 112.

In a region above the lower source metal layer 112a that corresponds to the region in which the gate pad GG is formed, on the other hand, an upper gate metal layer 114b of a gate metal layer 114 which has a two-layer structure, is formed on the lower source metal layer 112a through the interlayer insulating film 113.

The structure of a gate lead-out portion for electrically connecting the gate electrode 106 to the outside is described with reference to FIG. 3 which is a sectional view taken along the line D-D' of FIG. 1.

Figure 3:
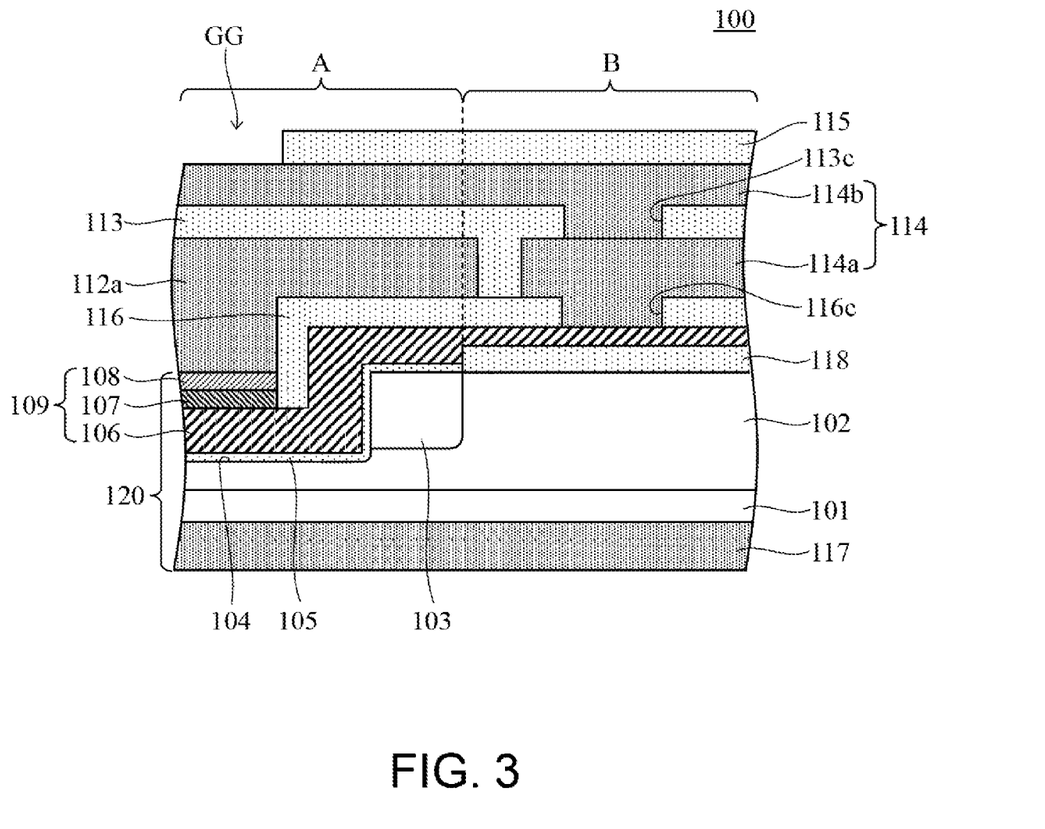
FIG. 3 is another sectional view of the semiconductor device according to the first embodiment of the present invention, and is a sectional view taken along the line D-D' of the semiconductor device of FIG. 1.

As illustrated in FIG. 3, the gate electrode 106 in an end portion of the active region A is led from inside the trench 104 onto the gate insulating film 105 on the upper surface of the semiconductor substrate 120, and further onto a field insulating film 118 in the field region B. An interlayer insulating film 116 which has a contact hole 116c to expose a part of an upper surface of the gate electrode 106 in the field region B and which selectively covers the upper surface of the gate electrode 106, is formed on the gate electrode 106. A lower gate metal layer 114a is formed on the interlayer insulating film 116 in the field region B. The lower gate metal layer 114a is formed so as to fill the contact hole 116c and is electrically connected to the gate electrode 106.

The interlayer insulating film 113 described above is formed so as to have a contact hole 113c in which a part of an upper surface of the lower gate metal layer 114a is exposed in the field region B, and to insulate the lower source metal layer 112a and the lower gate metal layer 114a from each other by connecting to the interlayer insulating film 116.

The interlayer insulating film 113 is formed, for example, as follows:

First, a metal film is formed to fill the contact hole 116c and to cover the upper surface of the gate insulating film 105, the upper surface of the polysilicon layer 108, the upper surface of the source region 110, the upper surface of the base contact region 111, and the interlayer insulating film 116. The metal film is next patterned into the shapes of the lower source metal layer 112a and the lower gate metal layer 114a. Then, as illustrated in FIG. 3, the interlayer insulating film 113 is formed so as to fill a gap between the lower source metal layer 112a and the lower gate metal layer 114a and to selectively cover an upper surface of the lower source metal layer 112a and the upper surface of the lower gate metal layer 114a.

The upper gate metal layer 114b described above is formed so as to connect to a part of the upper surface of the lower gate metal layer 114a that is exposed in the field region B. That is, the lower gate metal layer 114a and the upper gate metal layer 114b constitute the gate metal layer 114.

As illustrated in FIG. 2 and FIG. 3, an insulating film 115 is formed on the source metal layer 112 and the gate metal layer 114 so as to expose a part of the upper surface of the source metal layer 112 and a part of the upper surface of the gate metal layer 114 in order to form the source pad SS and the gate pad GG on the exposed surfaces.

The insulating film 115 is formed, for example, as follows:

First, a metal film is formed to fill the contact hole 113c and to cover the lower source metal layer 112a and the interlayer insulating film 113. The metal film is next patterned into the shapes of the upper source metal layer 112b and the upper gate metal layer 114b. Then, as illustrated in FIG. 2, the insulating film 115 is formed so as to fill a gap between the upper source metal layer 112b and the upper gate metal layer 114b and to selectively cover upper surfaces of the upper source metal layer 112b and the upper gate metal layer 114b.

The source metal layer 112 and the gate metal layer 114 thus each have a two-layer structure, and are isolated from each other by the interlayer insulating film 116, the interlayer insulating film 113, and the insulating film 115.

As described above, according to the semiconductor device 100 of the first embodiment, the bidirectional diode 109 and a vertical MOSFET can be formed in the same region in plan view by forming the N-type polysilicon layer as the gate electrode 106, the P-type polysilicon layer 107, and the N-type polysilicon layer 108 which are components of the bidirectional diode 109, in this order in the trench 104 in the direction perpendicular to the surface of the semiconductor substrate 120. This eliminates the need to situate the bidirectional diode in the field region as is the case for the prior art. In other words, a region in which the bidirectional diode 109 is formed can be counted as an element region, and a wide area can accordingly be secured for the element region.

Figure 4:
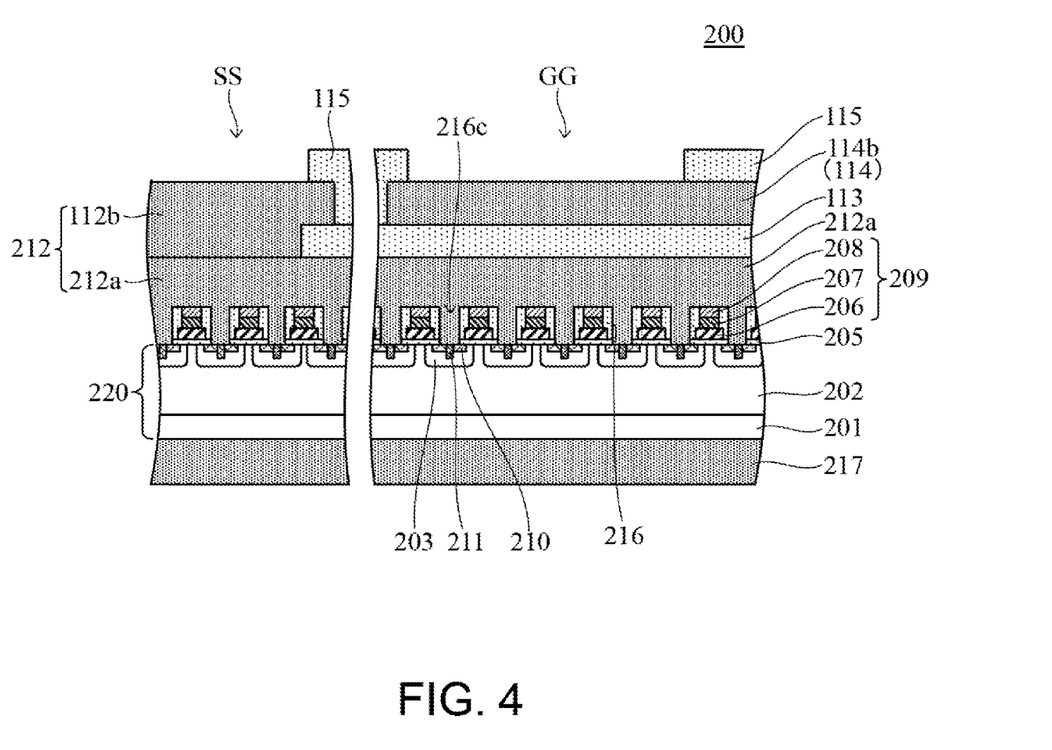
FIG. 4 is a sectional view taken along the line C-C' of the semiconductor device of FIG. 1 to illustrate the structure of a semiconductor device according to a second embodiment of the present invention.

FIG. 4 is a sectional view taken along the line C-C' of FIG. 1 to illustrate the structure of the semiconductor device 200 including a vertical MOSFET according to the second embodiment of the present invention.

The semiconductor device 200 according to the second embodiment differs from the semiconductor device 100 according to the first embodiment mainly in that the vertical MOSFET in the semiconductor device 200 is a planar vertical MOSFET in which no trench is formed in the semiconductor substrate and components of a bidirectional diode, namely, an n-type polysilicon layer (a gate electrode), a P-type polysilicon layer, and another N-type polysilicon layer, are layered on a surface of the semiconductor substrate. In the specific description given below, the same components as those in the first embodiment are denoted by the same reference symbols, and a redundant description on the same configuration as the one in the first embodiment is omitted as appropriate.

As illustrated in FIG. 4, the semiconductor device 200 according to the second embodiment has a semiconductor substrate 220 which includes an N-type high-concentration semiconductor layer 201 (e.g., a single-crystal silicon substrate) and an N-type drift region 202 (e.g., an epitaxial silicon layer) formed on the high-concentration semiconductor layer 201. The drift region 202 is lower in impurity concentration than the high-concentration semiconductor layer 201. The high-concentration semiconductor layer 201 and the drift region 202 form a drain region. A drain electrode 217 is provided on a rear surface of the semiconductor substrate 220.

A P-type base region 203, an N-type source region 210, and a P-type base contact region 211 are formed in an upper surface of the semiconductor substrate 220. The source region 210 is formed in the upper surface of the semiconductor substrate 220 in the base region 203. The base contact region 211 reaches the base region 203 from the upper surface of the semiconductor substrate 220 through the source region 210, and is higher in impurity concentration than the base region 203.

A gate electrode 206 composed of an N-type polysilicon layer is formed on the semiconductor substrate 20 through a gate insulating film 205, so as to form a channel in a part of the base region 203 that is in the upper surface of the semiconductor substrate 220. A P-type polysilicon layer 207 and an N-type polysilicon layer 208 are layered on the gate electrode 206 in this order in a direction perpendicular to the surface of the semiconductor substrate 220. The gate electrode 206, the P-type polysilicon layer 207, and the N-type polysilicon layer 208 constitute a bidirectional diode 209 with the gate electrode 206 as its one end and the N-type polysilicon layer 208 as its other end.

The base region 203 is formed by, for example, implanting P-type impurities from the upper surface of the semiconductor substrate 220 with the gate electrode 205 as a mask, and then diffusing the impurities by thermal diffusion so that the impurities spread to an area below the gate electrode 205. The source region 210 is formed by, for example, implanting N-type impurities from the upper surface of the semiconductor substrate 220 with the gate electrode 205 as a mask. The base contact region 211 is formed by implanting P-type impurities from the upper surface of the semiconductor substrate 220 with a photoresist having an opening above a part of the source region 210 as a mask.

An interlayer insulating film 216 is formed on regions of the semiconductor substrate 220 other than the bidirectional diode 209, to a height flush with the upper surface of the N-type polysilicon layer 208 which is the other end of the bidirectional diode 209. For each source region 210 and each base contact region 211, a contact hole 216c is formed in the interlayer insulating film 216 to expose upper surfaces of the source region 210 and the base contact region 211. A lower source metal layer 212a of a source metal layer 212 which has a two-layer structure, is formed on the polysilicon layer 208 and the interlayer insulating film 216. The lower source metal layer 212a is formed in the contact hole 216c as well to connect to the upper surface of the source region 210 and the upper surface of the base contact region 211. This gives the bidirectional diode 209 a configuration in which the polysilicon layer 208 at the other end is electrically connected to the source region 210.

As in the first embodiment, the interlayer insulating film 113 is formed on the lower source metal layer 212a. As in the first embodiment, the upper source metal layer 112b is formed to connect to the lower source metal layer 212a, in the region above the lower source metal layer 212a that corresponds to the region in which the source pad SS is formed. That is, the lower source metal layer 212a and the upper source metal layer 112b constitute the source metal layer 212.

As in the first embodiment, in the region above the lower source metal layer 212a that corresponds to the region in which the gate pad GG is formed, on the other hand, the upper gate metal layer 114b of the gate metal layer 114 which has a two-layer structure, is formed on the lower source metal layer 212a through the interlayer insulating film 113.

The structure of a gate lead-out portion for electrically connecting the gate electrode 206 to the outside in the second embodiment is, though not shown, substantially the same as the structure of the gate lead-out portion in the first embodiment illustrated in FIG. 3. Specifically, the gate electrode 206 is led from above the gate insulating film 205 on the upper surface of the semiconductor substrate 220 onto the field insulating film to connect to the lower gate metal layer formed above the field insulating film, in an area from an end portion of the active region to the field region. The upper gate metal layer 114b is formed so as to connect to a part of the upper surface of the lower gate metal layer that is exposed in the field region B. That is, the gate metal layer 114 is composed of the lower gate metal layer and the upper gate metal layer 114b.

As in the first embodiment, the insulating film 115 is formed on the source metal layer 212 and the gate metal layer 114 so as to expose a part of the upper surface of the source metal layer 212 and a part of the upper surface of the gate metal layer 114 in order to form the source pad SS and the gate pad GG on the exposed surfaces, respectively.

The source metal layer 212 and the gate metal layer 114 thus each have a two-layer structure, and are isolated from each other as in the first embodiment.

As described above, according to the semiconductor device 200 of the second embodiment, too, the bidirectional diode 209 and a vertical MOSFET can be formed in the same region in plan view as in the first embodiment by forming an N-type polysilicon layer as the gate electrode 206, the P-type polysilicon layer 207, and the N-type polysilicon layer 208 which are components of the bidirectional diode 209, in this order in a direction perpendicular to the surface of the semiconductor substrate 220. A wide area can accordingly be secured for the element region.

Figure 5:
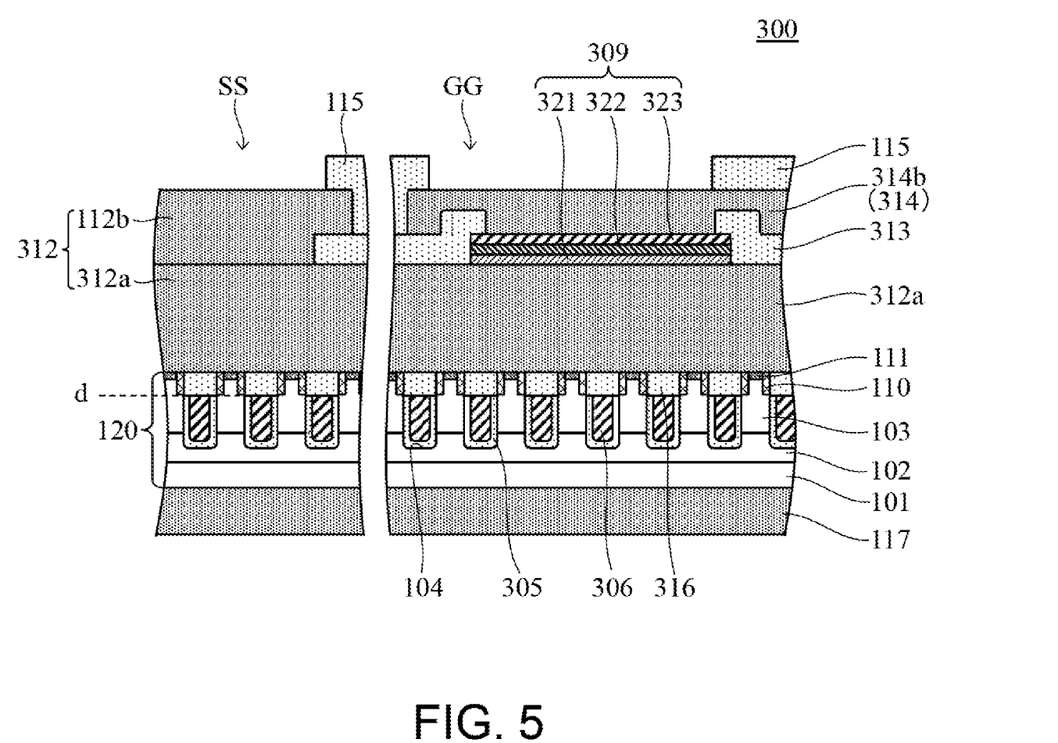
FIG. 5 is a sectional view taken along the line C-C' of the semiconductor device of FIG. 1 to illustrate the structure of a semiconductor device according to a third embodiment of the present invention.

FIG. 5 is a sectional view taken along the line C-C' of FIG. 1 to illustrate the structure of a vertical MOSFET in a semiconductor device 300 according to the third embodiment of the present invention.

The trench-type vertical MOSFET of the semiconductor device 300 according to the third embodiment is a trench-type vertical MOSFET which is the same type as the vertical MOSFET in the first embodiment, but the semiconductor device 300 differs from the semiconductor device 100 according to the first embodiment mainly in that a bidirectional diode is formed on the lower source metal layer, not in a trench. In the specific description given below, the same components as those in the first embodiment are denoted by the same reference symbols, and a redundant description on the same configuration as the one in the first embodiment is omitted as appropriate.

As illustrated in FIG. 5, the semiconductor device 300 according to the third embodiment has the semiconductor substrate 120 which includes, as in the first embodiment, the N-type high-concentration semiconductor layer 101, the N-type drift region 102, and the P-type base region 103. The high-concentration semiconductor layer 101 and the drift region 102 together form a drain region. The drain electrode 117 is provided on the rear surface of the semiconductor substrate 120.

The plurality of trenches 104 are formed in the base region 103. A gate insulating film 305 is formed in each trench 104 to cover inner bottom and side surfaces of the trench 104 from the bottom of the trench 104 to the depth d which is measured from the upper surface of the semiconductor substrate 120. A gate electrode 306 composed of a polysilicon layer is embedded in the trench 104 through the gate insulating film 305. An interlayer insulating film 316 fills a remaining space in the trench 104 above the gate insulating film 305 and the gate electrode 306.

As in the first embodiment, the N-type source region 110 is formed in a region adjacent to each upper external side surface of the trench 104. The P-type base contact region 111 is formed on a part of the upper surface of the semiconductor substrate 120 that is between adjacent source regions in the base region 103.

An upper surface of the interlayer insulating film 316, the upper surface of the source region 110, and the upper surface of the base contact region 111 are on the same plane, and a lower source metal layer 312a of a source metal layer 312 which has a two-layer structure is formed in contact with the upper surfaces.

A bidirectional diode 309 which includes an N-type polysilicon layer 321, a P-type polysilicon layer 322, and an N-type polysilicon layer 323 is provided on the lower source metal layer 312a in a region corresponding to a region in which the gate pad GG is formed. The N-type polysilicon layer 321, the P-type polysilicon layer 322, and the N-type polysilicon layer 323 are arranged in this order in a direction perpendicular to the surface of the semiconductor substrate 120.

An interlayer insulating film 313 is formed on the lower source metal layer 312a so as to cover at least a region other than the bidirectional diode 309 formed in the region corresponding to the region in which the gate pad GG is formed, and to expose a region corresponding to a region in which the source pad SS is formed. The bidirectional diode 309 is formed by, for example, forming a polysilicon layer on the lower source metal layer 312a by sputtering or other method, performing ion implantation, repeating the forming of a polysilicon layer and ion implantation to form a layered film in which an N-type polysilicon layer, a P-type polysilicon layer, and another N-type polysilicon layer are layered, and patterning the layered film. The interlayer insulating film 313 is formed by, for example, forming an insulating film on the entire upper surface of the lower source metal layer 312a including the upper surface of the bidirectional diode 309, and then patterning the insulating film so as to expose the upper surface of the N-type polysilicon layer 323 of the bidirectional diode 309 and the region corresponding to the region in which the source pad SS is formed.

The upper source metal layer 112b is formed to connect to the lower source metal layer 312a, in a region above the lower source metal layer 312a that corresponds to the region in which the source pad SS is formed. That is, the lower source metal layer 312a and the upper source metal layer 112b constitute the source metal layer 312.

In a region above the lower source metal layer 312a that corresponds to the region in which the gate pad GG is formed, on the other hand, an upper gate metal layer 314b of a gate metal layer 314 which has a two-layer structure is formed through the interlayer insulating film 313 and the bidirectional diode 309.

The structure of a gate lead-out portion for electrically connecting the gate electrode 306 to the outside in the third embodiment is, though not shown, substantially the same as the structure of the gate lead-out portion in the first embodiment illustrated in FIG. 3. Specifically, the upper gate metal layer 314b is formed in the field region B so as to connect to a part of the upper surface of the lower gate metal layer that is exposed in a contact hole formed in the interlayer insulating film 313. That is, the gate metal layer 314 is composed of the lower gate metal layer and the upper gate metal layer 314b.

The bidirectional diode 309 accordingly has a configuration in which the N-type polysilicon layer 323 at one end is electrically connected to the gate electrode 306 via the upper gate metal layer 314b (the gate metal layer 314), and the N-type polysilicon layer 321 at the other end is connected to the lower source metal layer 312a.

As in the first embodiment, the insulating film 115 is formed on the source metal layer 312 and the gate metal layer 314 so as to expose a part of the upper surface of the source metal layer 312 and a part of the upper surface of the gate metal layer 314 in order to form the source pad SS and the gate pad GG on the exposed surfaces.

The source metal layer 312 and the gate metal layer 314 thus each have a two-layer structure, and are isolated from each other as in the first embodiment.

As described above, according to the semiconductor device 300 of the third embodiment, too, the bidirectional diode 309 and the vertical MOSFET can be formed in the same region in plan view by forming the N-type polysilicon layer 321, the P-type polysilicon layer 322, and the N-type polysilicon layer 323 which are components of the bidirectional diode 309, in this order in the direction perpendicular to the surface of the semiconductor substrate 120. A wide area can accordingly be secured for the element region.

Figure 6:
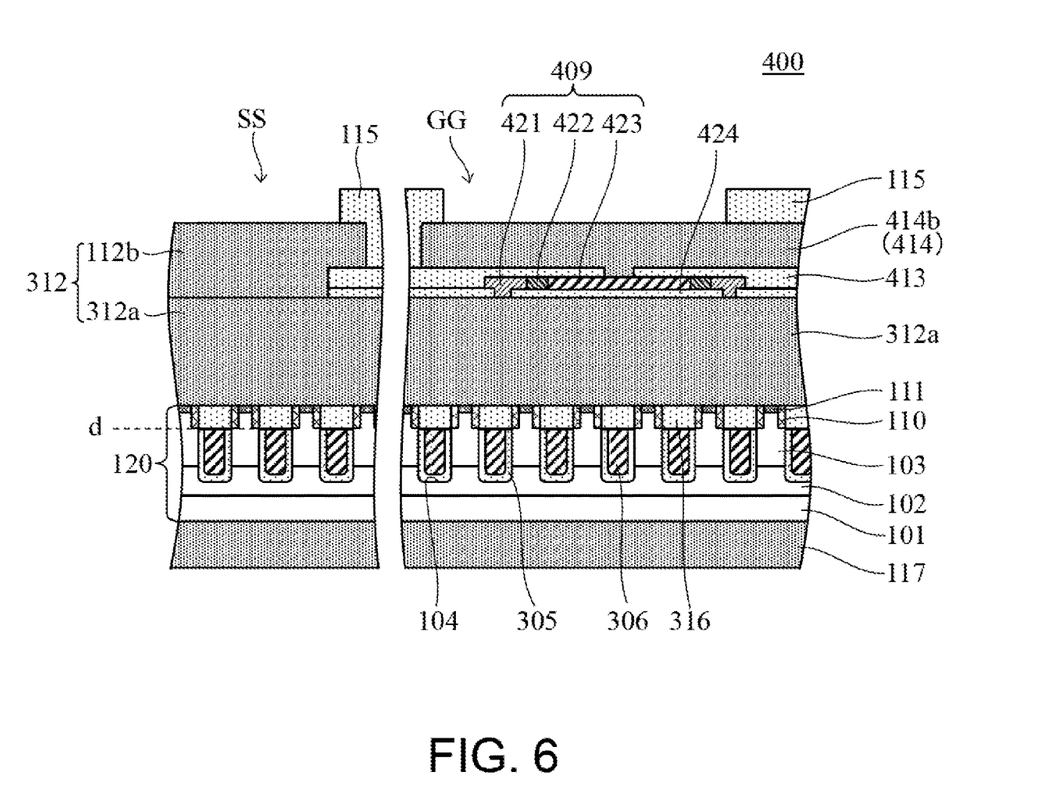
FIG. 6 is a sectional view taken along the line C-C' of the semiconductor device of FIG. 1 to illustrate the structure of a semiconductor device according to a fourth embodiment of the present invention.

FIG. 6 is a sectional view taken along the line C-C' of FIG. 1 to illustrate the structure of a vertical MOSFET in a semiconductor device 400 according to the fourth embodiment of the present invention.

The semiconductor device 400 according to the fourth embodiment differs from the semiconductor device 300 according to the third embodiment in the structure of the bidirectional diode. The rest of the semiconductor device 400 is substantially the same as the semiconductor device 300 according to the third embodiment. For that reason, the same components as those in the third embodiment are denoted by the same reference symbols, and a redundant description is omitted as appropriate.

As illustrated in FIG. 6, a bidirectional diode 409 which includes an N-type polysilicon layer 421, a P-type polysilicon layer 422, and an N-type polysilicon layer 423 is provided in the semiconductor device 400 according to the fourth embodiment on the lower source metal layer 312a in a region corresponding to a region in which the gate pad GG is formed as in the third embodiment. Unlike the third embodiment, the N-type polysilicon layer 421, the P-type polysilicon layer 422, and the N-type polysilicon layer 423 are arranged in this order in a direction parallel to the surface of the semiconductor substrate 120.

Specific configurations of the bidirectional diode 409 and its surroundings are described below.

An interlayer insulating film 424 is formed on the lower source metal layer 312a so as to cover at least a region corresponding to a region in which the gate pad GG is formed, and to expose a region corresponding to a region in which the source pad SS is formed. The bidirectional diode 409 is provided on the interlayer insulating film 424.

The N-type polysilicon layer 421 of the bidirectional diode 409 is connected to the lower source metal layer 312a through contact holes formed in the interlayer insulating film 424. An interlayer insulating film 413 covering the bidirectional diode 409 is formed on the interlayer insulating film 424. The bidirectional diode 409 is formed by, for example, forming a polysilicon layer in the contact holes that are formed in the interlayer insulating film 424, and on the interlayer insulating film 424, implanting N-type impurities in the polysilicon layer, and further implanting P-type impurities while using as a mask a photoresist that has an opening above a region designed to become the P-type polysilicon layer 422.

An upper gate metal layer 414b of a gate metal layer 414 which has a two-layer structure is formed above the lower source metal layer 312a through the interlayer insulating film 424, the bidirectional diode 409, and the interlayer insulating film 413, in a region corresponding to a region in which the gate pad GG is formed. The upper gate metal layer 414b is connected to the N-type polysilicon layer 423 of the bidirectional diode 409 via a contact hole formed in the interlayer insulating film 413.

The upper gate metal layer 414b has, as in the third embodiment, substantially the same structure as the structure of the gate lead-out portion in the first embodiment illustrated in FIG. 3. Specifically, the upper gate metal layer 414b is formed in the field region B so as to connect to a part of the upper surface of the lower gate metal layer that is exposed in a contact hole formed through the interlayer insulating films 424 and 413. That is, the gate metal layer 414 is composed of the lower gate metal layer and the upper gate metal layer 414b.

The bidirectional diode 409 accordingly has a configuration in which the N-type polysilicon layer 423 at one end is electrically connected to the gate electrode 306 via the upper gate metal layer 414b (the gate metal layer 414), and the N-type polysilicon layer 421 at the other end is connected to the lower source metal layer 312a.

As in the first embodiment, the insulating film 115 is formed on the source metal layer 312 and the gate metal layer 414 so as to expose a part of the upper surface of the source metal layer 312 and a part of the upper surface of the gate metal layer 414 in order to form the source pad SS and the gate pad GG on the exposed surfaces.

The source metal layer 312 and the gate metal layer 414 thus each have a two-layer structure, and are isolated from each other as in the first embodiment.

As described above, according to the semiconductor device 400 of the fourth embodiment, too, the bidirectional diode 409 and the vertical MOSFET can be formed in the same region in plan view, and the same effect as in the first embodiment to the third embodiment can be obtained.

It is apparent that the present invention is not limited to the above embodiments, and may be modified and changed without departing from the scope and spirit of the invention.

For instance, while a semiconductor device in which the first conductivity type is the N type, the second conductivity type is the P type, and an N-type vertical MOSFET is included is taken as an example in the embodiments described above, the present invention is also applicable to a semiconductor device in which the conductivity types are switched and a P-type vertical MOSFET is included.

The number of layers in the bidirectional diode in each of the embodiments is not limited to three which is the case in the descriptions given above, and may be five, seven, or more.

In the description given above, the polysilicon layers 321 and 323 in the bidirectional diode 309 of the third embodiment are N-type layers while the polysilicon layer 322 is a P-type layer, and the polysilicon layers 421 and 423 in the bidirectional diode 409 of the fourth embodiment are N-type layers while the polysilicon layer 422 is a P-type layer. N-type layers can be used as the polysilicon layers 322 and 422 while P-type layers are used as the polysilicon layers 321 and 323 and the polysilicon layers 421 and 423.

The third embodiment and the fourth embodiment which take as an example a semiconductor device including a trench-type vertical MOSFET in the description given above, are also applicable to a semiconductor device in which a planar type vertical MOSFET is included in place of a trench-type vertical MOSFET.

What is claimed is:

1. A semiconductor device, comprising:
   a semiconductor substrate;

a drain region of a first conductivity type and a source region of the first conductivity type formed in the semiconductor substrate;

a base region of a second conductivity type formed between the drain region and the source region;

a base contact region of the second conductivity type formed in the base region and being higher in concentration than the base region;

a gate electrode formed in the base region through a gate insulating film so that a channel is formed in the base region;

a bidirectional diode having a first end electrically connected to the source region;

a source metal layer electrically connected to the source region, the base contact region, and the first end of the bidirectional diode; and a gate metal layer electrically connected to the gate electrode, and overlapping at least partially with the source metal layer in a first direction perpendicular to a surface of the semiconductor substrate, in at least a part of a region on the semiconductor substrate, wherein the gate electrode is composed of a polysilicon layer of the first conductivity type, wherein the bidirectional diode includes the gate electrode, a second polysilicon layer of the second conductivity type formed on the gate electrode, and a third polysilicon layer of the first conductivity type formed on the second polysilicon layer, and wherein the gate electrode, the second polysilicon layer, and the third polysilicon layer are arranged in this order in the first direction.

2. The semiconductor device according to claim 1, further comprising a trench formed in the semiconductor substrate;

wherein the drain region is formed in the semiconductor substrate to have a predetermined thickness from a rear surface of the semiconductor substrate, wherein the trench reaches an upper surface of the drain region from an upper surface of the semiconductor substrate, wherein the gate insulating film covers inner bottom and side surfaces of the trench, and wherein the gate electrode is embedded in the trench through the gate insulating film.

3. The semiconductor device according to claim 2, wherein the second polysilicon layer is embedded in the trench through the gate insulating film.

4. The semiconductor device according to claim 3, wherein the third polysilicon layer is embedded in in the trench through the gate insulating film.

5. The semiconductor device according to claim 1, wherein the bidirectional diode is provided in the semiconductor substrate through the gate insulating film.

6. The semiconductor device according to claim 1, wherein a second end of the bidirectional diode is connected to the gate metal layer, and the first end of the bidirectional diode is connected to the source metal layer.

* * * * *